(12) United States Patent
Pascucci

(10) Patent No.: US 6,424,575 B1
(45) Date of Patent: Jul. 23, 2002

(54) SYNCHRONOUS OUTPUT BUFFER, PARTICULARLY FOR NON-VOLATILE MEMORIES

(75) Inventor: Luigi Pascucci, Sesto San Giovanni (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 64 days.

(21) Appl. No.: 09/716,759

(22) Filed: Nov. 20, 2000

(30) Foreign Application Priority Data

Nov. 26, 1999 (IT) .......................... MI99A2480

(51) Int. Cl.[7] .............................................. G11C 16/04
(52) U.S. Cl. ............................ 365/189.05; 365/189.11; 327/208; 327/215
(58) Field of Search ................... 365/189.05, 189.11, 365/185.08; 326/27, 28, 82, 83, 87; 327/112, 208, 215

(56) References Cited

U.S. PATENT DOCUMENTS

| | | | | |
|---|---|---|---|---|
| 5,450,019 A | * | 9/1995 | McClure et al. | ............ 326/121 |
| 5,684,410 A | * | 11/1997 | Guo | ............................ 326/27 |
| 5,886,929 A | * | 3/1999 | Becker et al. | ......... 365/189.05 |
| 6,225,824 B1 | * | 5/2001 | Madhu et al. | ................ 326/27 |

* cited by examiner

*Primary Examiner*—Richard Elms
*Assistant Examiner*—VanThu Nguyen
(74) *Attorney, Agent, or Firm*—Lisa K. Jorgenson; Allen, Dyer, Doppelt, Milbrath & Gilchrist, P.A.

(57) ABSTRACT

An output buffer, particularly for non-volatile memories, includes a push-pull output stage, a first data latch circuit receiving as an input data from an external data bus which connects at least one memory to the first data latch circuit, first and second activation paths for the activation of the push-pull stage, first and second circuits for enabling the push-pull stage, first and second circuits for disabling the push-pull stage, and second and third data latch circuits connected to the push-pull stage. More specifically, the first and second activation paths may be connected to the first data latch circuit. Furthermore, the first and second circuits for enabling the push-pull stage may be connected between the first data latch circuit and the push-pull stage. The first and second circuits for disabling the push-pull stage may be respectively connected between the first and second activation paths and the first data latch circuit and may receive as inputs an output enable signal and a data updating signal. Additionally, the second and third data latch circuits may be connected between the push-pull stage and, respectively, the first and second activation paths for the activation of the push-pull stage.

35 Claims, 4 Drawing Sheets

SYNCHRONOUS OUTPUT BUFFER, PARTICULARLY FOR NON-VOLATILE MEMORIES

FIELD OF THE INVENTION

The present invention relates to electronic memory devices, and, more particularly, to synchronous output buffers, especially for non-volatile memories.

BACKGROUND OF THE INVENTION

It is known in the art that the buffers of a non-volatile memory generally display the data stored in the memory. The buffers also provide a high-impedance (tristate) condition of the memory when it is necessary to transfer to other memory units the control of an external buffer which interfaces with the memory. The networks that are generally used provide the buffer function by logic chains on multiple levels. The length of the implemented chains include transit times which, despite being modest in standard power supply conditions (e.g., 5 V), become significant at lower voltages (e.g., 3 V).

Moreover, conventional buffers immediately display the data after it is received. This causes difficulties in deferring switching of the output stages to provide appropriate protocol synchronizations (burst-type reading). The need for high speeds (even at low power supply voltages) and for easy adaptation (even to synchronous protocols) may render conventional output buffer structures inefficient.

SUMMARY OF THE INVENTION

An object of the present invention is to provide an output buffer which has a minimal data transit time.

Another object of the present invention is to provide an output buffer in which data item updating is performed by an appropriate pulse that can be synchronized with external controls.

A further object of the present invention is to provide an output buffer in which it is possible to defer updating an external display of a new data item in the buffer.

Yet another object of the present invention is to provide an output buffer that allows a last read data item to be kept in the memory.

Still another object of the present invention is to provide an output buffer that allows limiting the switching noise of the output stage.

An additional object of the present invention is to provide an output buffer that is highly reliable and relatively easy to manufacture at competitive costs.

These and other objects which will become more apparent hereinafter are provided by an output buffer, particularly for non-volatile memories, including a push-pull output stage, a first data latch circuit receiving as an input data from an external data bus which connects at least one memory to the first data latch circuit, first and second activation paths for the activation of the push-pull stage, first and second circuits for enabling the push-pull stage, first and second circuits for disabling the push-pull stage, and second and third data latch circuits connected to the push-pull stage.

More specifically, the first and second activation paths may be connected to the first data latch circuit. Furthermore, the first and second circuits for enabling the push-pull stage may be connected between the first data latch circuit and the push-pull stage. The first and second circuits for disabling the push-pull stage may be respectively connected between the first and second activation paths and the first data latch circuit and may receive as inputs an output enable signal and a data updating signal. Additionally, the second and third data latch circuits may be connected between the push-pull stage and, respectively, the first and second activation paths for the activation of the push-pull stage.

BRIEF DESCRIPTION OF THE DRAWINGS

Further characteristics and advantages of the present invention will become more apparent from the following detailed description of a preferred but not exclusive embodiment of an output buffer illustrated by way of non-limitative example in the accompanying drawings, wherein.

DETAILED DESCRIPTION OF THE PREFERRED EMBODIMENTS

Figure 1:
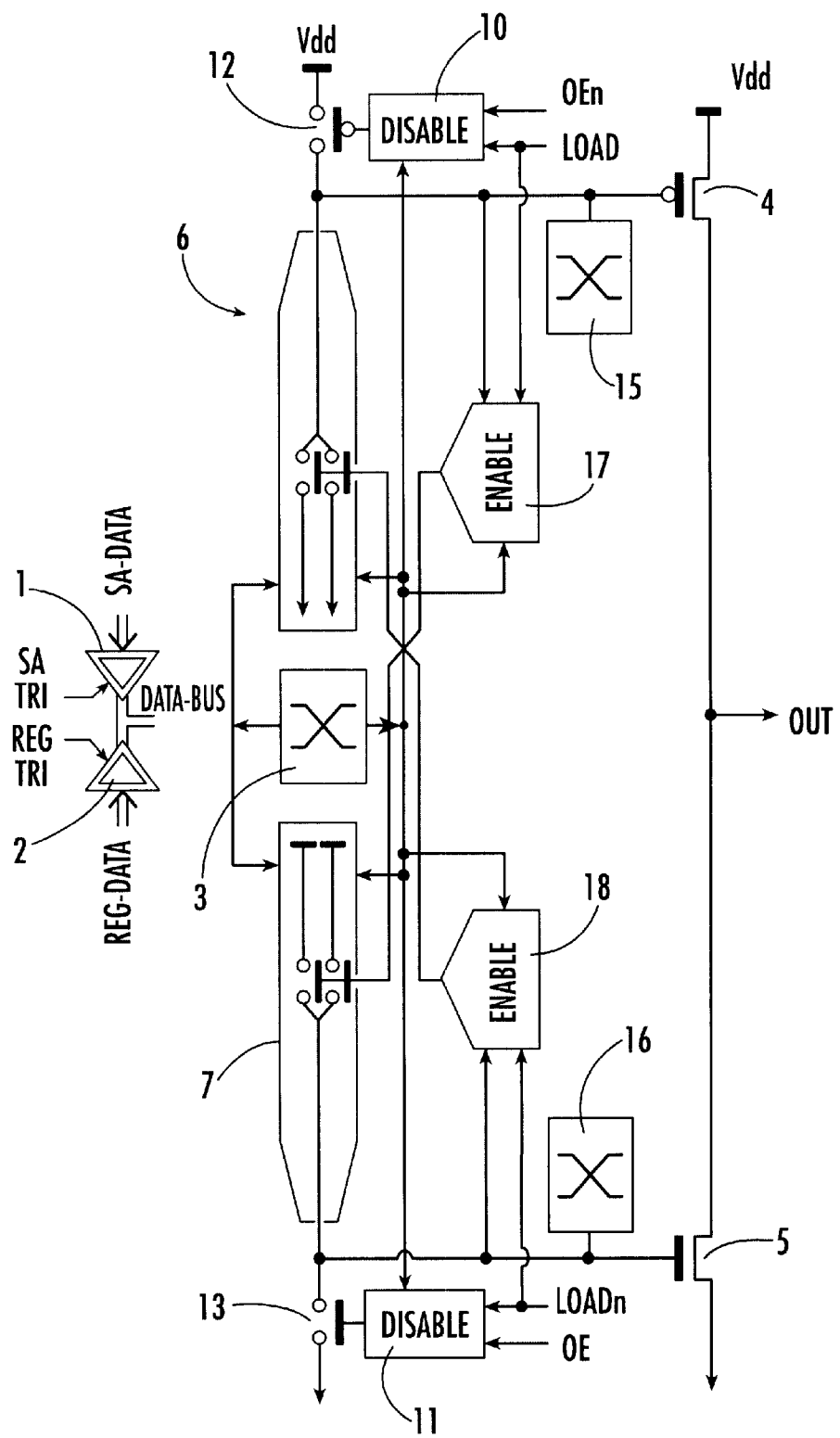
FIG. 1 is a schematic block diagram of an output buffer according to the present invention.

The output buffer according to the present invention includes a data bus DATA-BUS which receives data from at least one memory bank and preferably also from a data register. As shown in FIG. 1, a structure of the tristate type 1 is connected between the data bus and a sense amplifier of a memory bank or multiple memory banks (not shown). Data from the memory bank(s) are designated SA-DATA. A structure 2 of the tristate type provides a connection between the data bus and a data register. This may be used, for example, for testing purposes and the data received therefrom is designated REG-DATA. The tristate structure 1 is driven by a signal SA-TRI, while the tristate structure 2 is driven by a signal REG-TRI.

The data bus DATA-BUS is bidirectionally connected to a first data latch circuit 3 and to first and second modulated circuits 6, 7 for activating a pair of push-pull transistors 4, 5. The transistor 4 is a P-channel MOS transistor in which the source terminal is connected to the supply voltage Vdd and the drain terminal is connected to the drain terminal of the transistor 5. The transistor 5 is an N-channel MOS transistor in which the source terminal is connected to ground. The gate terminals of the transistors 4, 5 are respectively connected to the first and second modulated activation circuits 6, 7.

The first data latch circuit 3 is also connected to a circuit or means 10 for disabling the P-channel transistor 4 and to a circuit or means 11 for disabling the N-channel 5. The means 10 for disabling the transistor 4 receives as an input an inverted output enable signal OEn and a data loading signal LOAD, and is connected at its output to a P-channel MOS transistor 12. A source terminal of the transistor 12 is connected to the supply voltage Vdd, and a drain terminal thereof is connected to the modulated activation path 6.

Similarly, the means 11 for disabling the transistor 5 receives as an input the output enable signal OE and the inverted data load signal LOADn. The means 11 is connected at its output to the gate terminal of an N-channel MOS transistor 13. A source terminal of the transistor 13 is connected to ground and a drain terminal thereof is connected to the second modulated activation path 7.

The output buffer according to the invention further includes second and third data latch circuits 15, 16 dedicated respectively to the P-channel MOS transistor 4 and to the N-channel MOS transistor 5. The second and third data latch circuits 15 and 16 are connected to the gate terminals of the transistors 4, 5, respectively.

Moreover, the output buffer according to the invention includes a respective circuit or means 17, 18 for enabling the transistors 5, 4. That is, the enable means 17 enables the N-channel transistor 5, while the enable means 18 enables the P-channel transistor 4. The enable means 17 receives as an input the signal input to the gate terminal of the MOS transistor 4, the signal LOAD, and the signal output from the first data latch circuit 3. Similarly, the second enable means 18 receives as an input the signal LOADn, the signal sent to the gate terminal of the N-channel MOS transistor 5, and the signal output by the first data latch circuit 3. The means 18 for enabling the P-channel transistor 4 may be a NOR gate, and the means 17 for enabling the N-channel MOS transistor 5 may be a NAND gate, as shown in FIG. 2.

Figure 2:
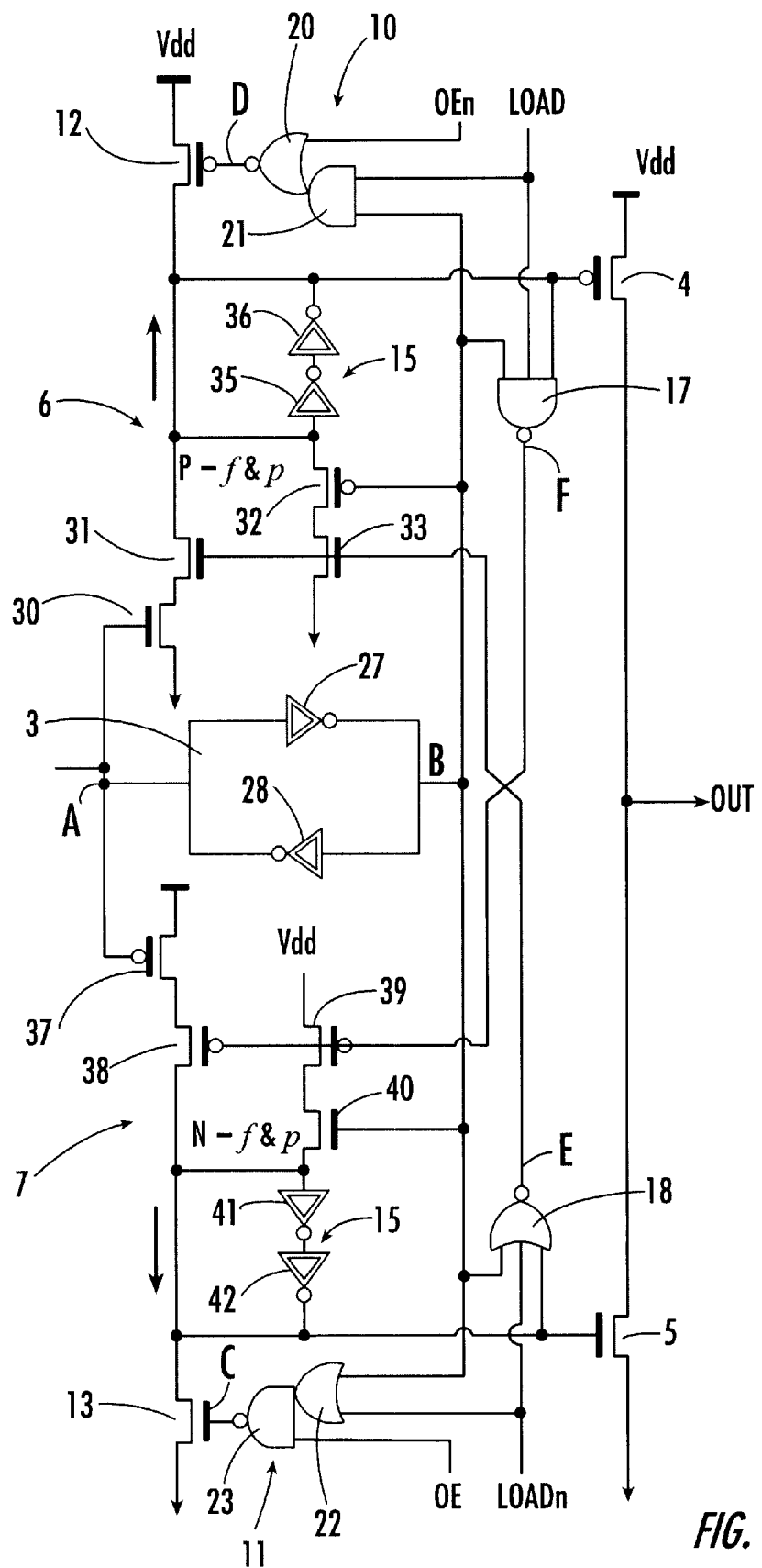
FIG. 2 is a schematic diagram showing portions of FIG. 1 in further detail.

FIG. 2 provides a more detailed view of the output buffer of FIG. 1. As shown in FIG. 2, the means 10 for disabling the P-channel transistor 4 includes a pair of logic gates, respectively a NOR gate 20 connected to an output of an AND gate 21. Likewise, the means 11 for disabling the N-channel MOS transistor is formed by a NOR gate 22 having an output connected to an input of a NAND gate 23. The NAND gate 23 also receives as an input the signal OE.

The data latch circuit 3 includes a pair of inverters 27 and 28 which are mutually parallel-connected. The modulated activation paths 6 of the transistor 4 is formed by a pair of N-channel MOS transistors 30, 31. The transistors 30, 31 have common-connected drain and source terminals. Also, the transistor 31 is connected to the drain terminal of the MOS transistor 12.

The circuit branch formed by the transistors 30 and 31 provides a "fast" branch of the modulated activation path of the N-channel MOS transistor. On the other hand, a circuit branch formed by two MOS transistors, respectively a P-channel transistor 32 and an N-channel transistor 33, provides a "slow" branch for the activation of the P-channel MOS transistor 4. The MOS transistors 32 and 33 have respective common-connected drain terminals, and the MOS transistor 33 is connected to ground.

The MOS transistor 32 is connected by its gate terminal to the output of the data latch circuit 3 and by its source terminal to a pair of inverters 35 and 36 arranged in a cascade configuration. The output of the inverter 36 is connected to the gate terminal of the P-channel MOS transistor 4. Similarly, the second modulation path 7 of the N-channel MOS transistor 5 includes two transistors 37, 38 that provide the "fast" circuit branch of the modulation path. The transistors 37, 38 may be P-channel MOS transistors in which the drain terminals and source terminals are respectively common-connected.

The second circuit branch of the second modulated path 7 includes a P-channel MOS transistor 39 and an N-channel MOS transistor 40 which have common-connected drain terminals. The source terminal of the MOS transistor 39 is connected to the supply voltage Vdd, and the gate terminal of the MOS transistor 40 is connected to the output of the data latch circuit 3.

In the first modulated activation path, the source terminal of the MOS transistor 32 is connected to the source terminal of the MOS transistor 31 and, similarly, the drain terminal of the MOS transistor 40 is connected to the drain terminal of the MOS transistor 38. The drain terminal of the MOS transistor 40 is further connected to a pair of inverters 41, 42 arranged in a cascade configuration, like the inverters 35, 36. The inverter 42 is also connected to the gate terminal of the N-channel MOS transistor 5.

The output buffer according to the present invention is capable of independently retaining in memory, using the three data latch circuits 3, 15 and 16, the configuration of the gate terminals of the transistors 4 and 5. This includes the push-pull and the information of the data item related to the last read cycle. While the buffer is being updated, the three data latch circuits 3, 15 and 16 have the same configuration, i.e., "0" or "1" (deferred in time). Yet, this condition is such that the tristate condition (circuit 15=1 and circuit 16=0) is interposed between the two states (1 or 0).

Moreover, the buffer according to the invention is capable of modifying the output state only in the domain of the "load" phase. It may also allow different configurations between the latch circuit 3 and the pair of latch circuits 15 and 16 when buffer updating is disabled (LOAD=0). Furthermore, it may prevent symmetrical activation of the transistors 4, 5.

When the buffer is deactivated (tristate condition), the latch circuits of the transistors 4 and 5 (i.e., the circuits 15 and 16) have the configurations "0" and "1" respectively for the N-channel transistor 5 and for the P-channel transistor 4. The data latch circuit 3 may be either "0" or "1" according to the last updated data item. The disable means 10 and 11 are activated exclusively and oversee the disabling of the corresponding controlled active transistor, if any (i.e., the transistors 4, 5 respectively).

The disable means 10, 11 are activated in a pulsed manner, are synchronous with the "LOAD" update signal, and functionally precede each propagation within the buffer. This places the buffer in a temporary tristate configuration. The enable means 17 and 18 also are activated exclusively at the end of the achieved tristate condition, are synchronous with the update pulse LOAD, and functionally follow the deactivation of the disable means 10, 11. This allows activation of the paths of the transistors 4, 5.

The paths for the activation of the transistors 4, 5 (i.e., the modulated circuits 6, 7) are separated into two circuit branches. The branch formed by the pair of transistors 30, 31 of the path 6 and 37, 38 for the path 7 allows complete development of the signal. The branch formed by the transistors 32 and 33 for the path 6 and 39, 40 for the path 7 allows only partial development. This allows the activation of the transistors 4, 5 to have two dynamic behaviors. First, a fast dynamic behavior in the initial part, with simultaneous activation of the branches formed by the transistors 30, 31 and 32, 33 for the path 6 and 37, 38 and 39, 40 for the path 7. Secondly, a slow dynamic behavior in the second part, with activation only of the branch formed by the transistors 30, 31 for the path 6 and 37, 38 for the path 7.

This allows controlling (i.e., by limiting) the maximum current pulse of the stage formed by the transistors 4, 5. Therefore, the noise caused by stage switching is thus reduced. The tristate condition is forced directly by both disable means 10, 11 by forcing the signal OE (OEn). Upon activation of the output buffer (OE=1), the tristate condition persists until the first updating pulse LOAD arrives. This is the case even if the data item to be displayed externally is already present in the latch circuit 3. This provides a natural synchronization of the transitions with real requests made by the external system to the output buffer.

The updating of the data latch circuit 3 therefore does not necessarily require external visibility of the data. This allows the transitions of the MOS transistors 4, 5, which are also synchronous with external timing (e.g., external updates timed by CLOCK pulses). The internal data bus DATA-BUS is kept in the configuration of the last reading performed by the data latch circuit 3. The control signal LOAD, which oversees the updating of the data toward the outside, can be of the pulsed type or of the continuous and unlimited type. It can even be masked out if necessary to maintain unchanged the output state of the buffer according to the invention, or to update the data item without making it externally visible.

As shown by the circuit diagrams of FIGS. 1 and 2, the output OUT of the buffer according to the present invention is taken directly at the common node between the drain terminals of the MOS transistors 4, 5. If the data item on the data bus DATA-BUS is 1 and therefore the node A of FIG. 2 is high, the node B output to the data latch circuit 3 is low. Also, the node C, taken at the gate terminal of the MOS transistor 13, is high, and so is the node D at the gate terminal of the MOS transistor 12. Therefore, the N-channel MOS transistor 5 is off, the node E (i.e., the output of the NOR gate 18) is high, and the modulation path 6 is enabled with both branches formed by the transistors 30, 31 and 32, 33 (i.e., the modulation path 7 is enabled). In this case, the P-channel MOS transistor 4 receives a low signal at its gate terminal. Thus, the transistor 4 is on and the output OUT is equal to 1. The complementary case of the above is the one in which a low signal "0" appears on the data bus DATA-BUS.

Figure 3:
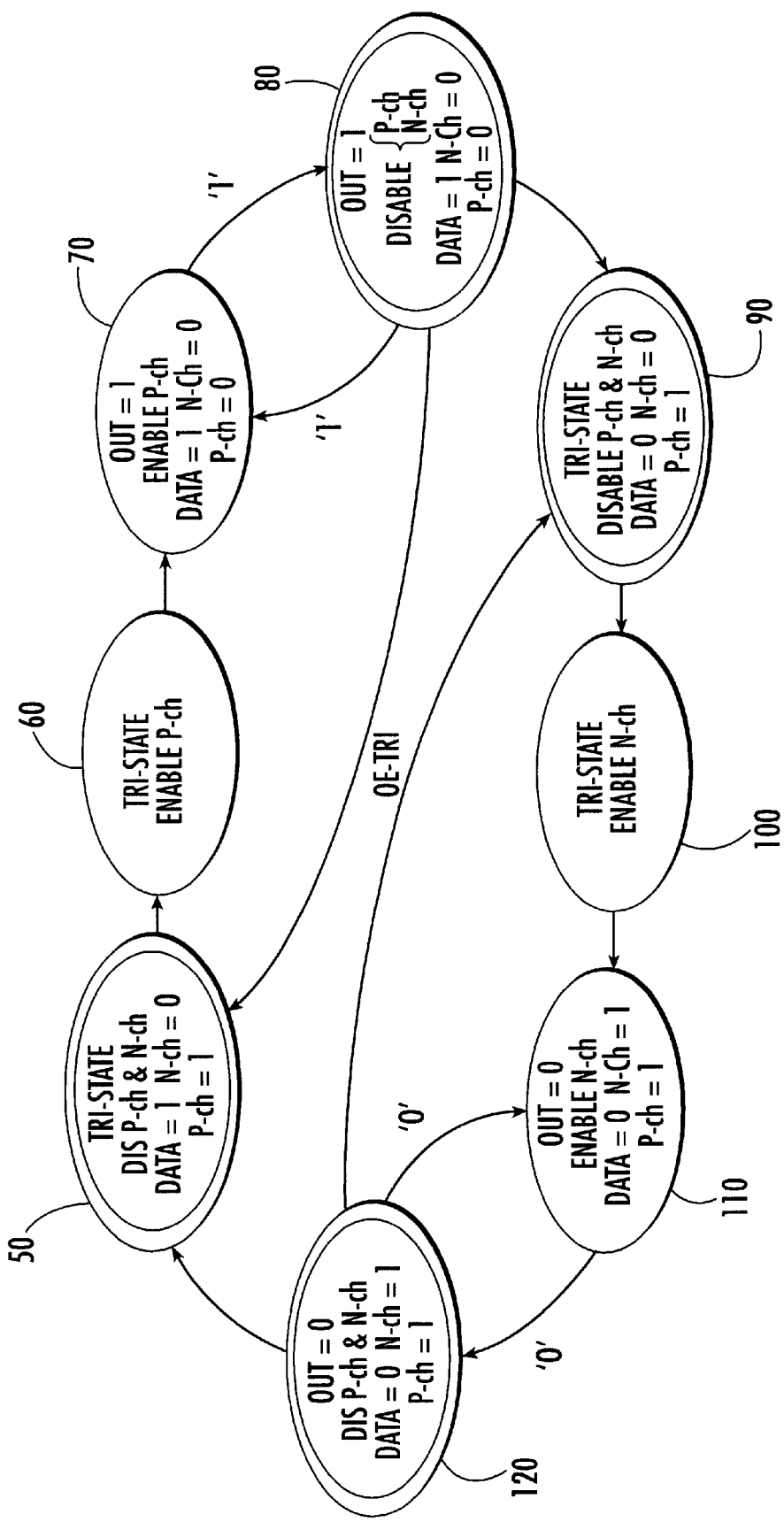
FIG. 3 is a chart which plots transitions of the output buffer shown in FIGS. 1 and 2.
Figure 4:
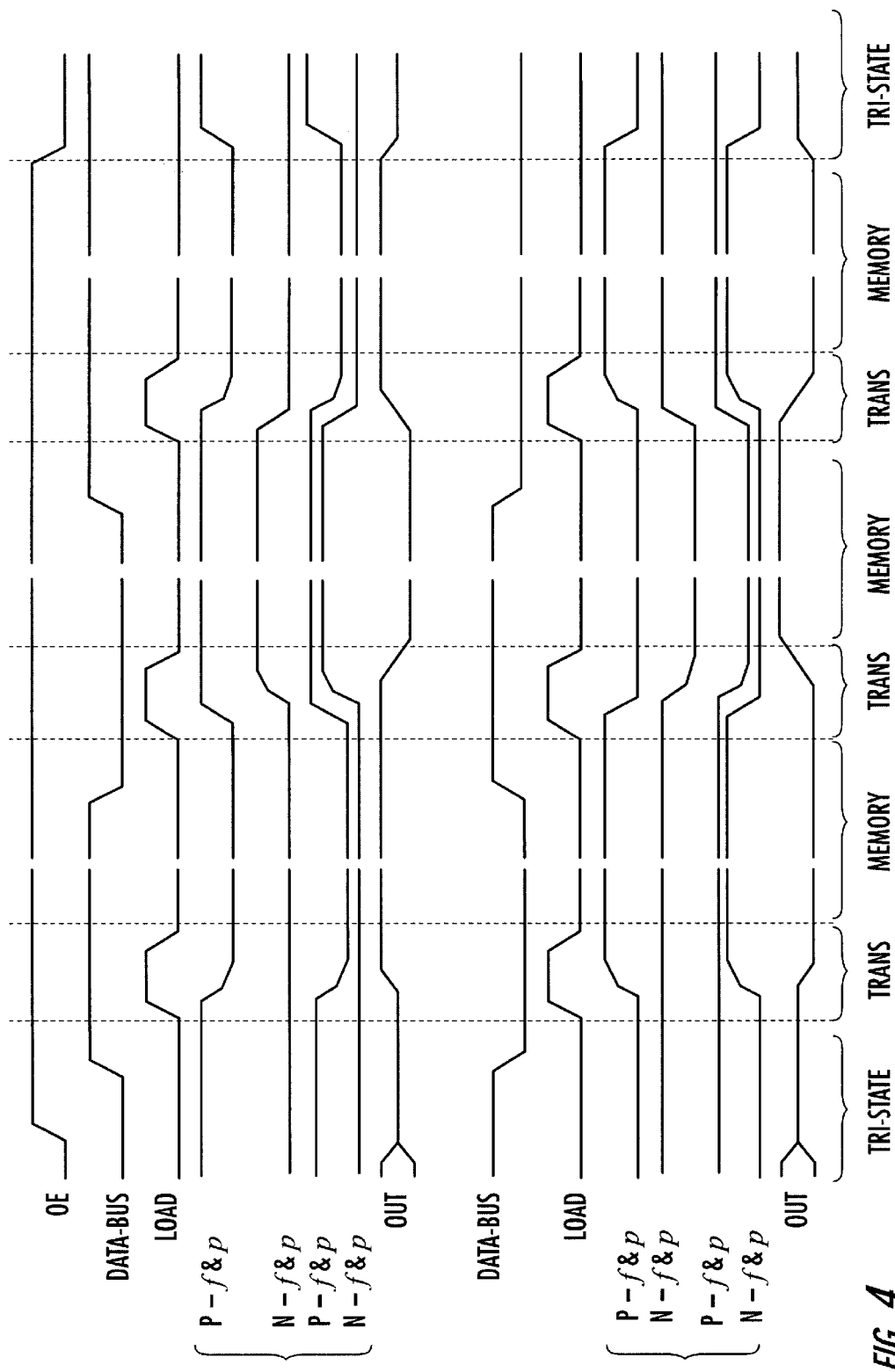
FIG. 4 is a timing diagram of signals used in the buffer according to the present invention.

FIG. 4 is a timing diagram of the signals in different conditions of the buffer according to the invention. One can recognize tristate conditions, transition conditions designated by TRANS, and memorization conditions designated by MEMORY. FIG. 3 is a chart of the state transitions that occur in the output buffer according to the invention.

With reference to FIG. 3, assuming a tristate starting condition in which the MOS channel transistors 4, 5 are both disabled and that the data input to a buffer DATA is equal to 1, the N-channel transistor 5 and P-channel transistor 4 are respectively off. This condition is designated by the reference numeral 50. From this condition, the system reaches a tristate condition in which the P-channel transistor is enabled (step 60).

The system then advances to a step 70 in which the output OUT is equal to 1, the P-channel transistor is enabled, the data item DATA=1, and the P-channel MOS transistor 4 and the N-channel MOS transistor 5 respectively have a low signal at their gate terminals. From the step 70, the system advances to a step 80 in which the output OUT=1, the P-channel and N-channel transistors are disabled, the data item DATA=1, and the N-channel transistor is off while the P-channel is on (low value on its gate terminal).

If the data item remains "1," then the system returns from step 80 to step 70. Otherwise, the system can pass from step 80 to tristate conditions, and therefore from the step 50. It is also possible to reach tristate conditions by disabling the P-channel and N-channel transistors with the data item DATA=0 and where the N-channel and P-channel transistors are both off. From this last step 90, the system can pass to the step 100, which is complementary to the step 60. Likewise, the step 90 is complementary with respect to the step 50.

In step 100, therefore, there is a tristate condition with enabling of the N-channel transistor 5. The system passes from step 100 to step 110, which is complementary to the step 70 and in which the output of the buffer OUT=0, the N-channel transistor is enabled, the data item DATA=0, and the P-channel transistor is off. The system passes from step 110 to a step 120 in which the data item is held at zero, and therefore the output OUT=0. The P-channel and N-channel transistors 4, 5 are disabled.

From step 120, the system can enter a tristate condition entered by advancing to step 90. The step 120 is complementary with respect to the step 80. From step 120, if the data item DATA remains "1," the system passes to step 110, which is complementary with respect to the step 70. The state transition is completed with the transition from step 120 to the above described step 50.

In practice, it has been observed that the buffer according to the invention allows storing the last read data item while keeping its visibility masked until it is necessary to transfer the data item externally. That is, there is independence between the data updating activity and the visibility of the data item outside the buffer. Moreover, the structure thus conceived substantially eliminates the noise caused by transitions as well as "crowbar" currents.

The updating step is in fact characterized by a direct connection between the latch circuits 3, 15 and 16 only for the time for which the LOAD pulse is valid. The pulse is advantageously generated so that it is very short to prevent the effects of noise from altering the freshly displayed data item.

The buffer according to the present invention is subject to numerous modifications and variations, all of which are within the scope of the inventive concept. Furthermore, the elements of the buffer may also be replaced with other technically equivalent elements, as will be appreciated by those of skill in the art.

Italian Patent Application No. MI99A002480, from which this application claims priority, is hereby incorporated herein in its entirety by reference.

That which is claimed is:

1. An output buffer for non-volatile memories comprising:
   a push-pull output stage;
   a first data latch circuit receiving input data from an external data bus;
   first and second activation paths connected to said first data latch circuit for activating said push-pull output stage;
   first and second enabling circuits connected between said first data latch circuit and said push-pull output stage for enabling said push-pull output stage;
   first and second disabling circuits respectively connected between said first and second activation paths and said first data latch circuit for disabling said push-pull output stage and receiving as inputs an output enable signal and a data update signal; and
   second and third data latch circuits connected between said push-pull output stage and, respectively, said first and second activation paths.

2. The output buffer according to claim 1 wherein said push-pull output stage comprises a P-channel MOS transistor and an N-channel MOS transistor connected between a power supply voltage and ground, said P-channel MOS transistor also being connected at a drain thereof to the N-channel MOS transistor.

3. The output buffer according to claim 2 wherein said first and second activation paths are respectively connected to said P-channel MOS transistor and to said N-channel MOS transistor.

4. The output buffer according to claim 3 wherein said first activation path is connected to said second enabling circuit for enabling said P-channel MOS transistor; and wherein said second activation path is connected to said first enabling circuit for enabling said N-channel MOS transistor.

5. The output buffer according to claim 4 wherein said first enabling circuit receives as inputs the data update signal, an output signal from said first data latch circuit, and an output signal from said first activation path; and wherein the output signal of said first activation path is input to said P-channel MOS transistor.

6. The output buffer according to claim 4 wherein said second enabling circuit receives as inputs the data update signal, an output signal from said first data latch circuit, and an output signal from said second activation path; and wherein the output signal of said second activation path is input to said N-channel MOS transistor.

7. The output buffer according to claim 4 wherein said first and second activation paths each respectively comprise a first circuit branch and a second circuit branch; wherein a simultaneous activation of said first circuit branches and said second circuit branches provides a fast initial activation of said P-channel and N-channel MOS transistors; and wherein an activation of only said first circuit branches provides a slow activation of said P-channel and N-channel MOS transistors.

8. The output buffer according to claim 7 wherein said first circuit branch of said first activation path comprises two N-channel MOS transistors connected in series; and wherein said first circuit branch of said second activation path comprises two P-channel MOS transistors connected in series.

9. The output buffer according to claim 7 wherein said second circuit branch of said first activation path comprises a P-channel MOS transistor and an N-channel MOS transistor connected in series; and wherein said second circuit branch of said second activation circuit comprises a P-channel MOS transistor and an N-channel MOS transistor connected in series.

10. The output buffer according to claim 2 wherein said second and third data latch circuits are respectively connected to gate terminals of said P-channel MOS transistor and of said N-channel MOS transistor.

11. The output buffer according to claim 2 wherein an output of said push-pull output stage is taken at a circuit branch connected between said P-channel and N-channel MOS transistors.

12. The output buffer according to claim 1 wherein said first disabling circuit respectively receives as inputs an output signal from said first activation path, an output signal from said first data latch circuit, and an inverted output enable signal; and wherein said second disabling circuit receives as inputs an output signal of said second activation path, the output signal of said first data latch circuit, and an inverted data update signal.

13. The output buffer according to claim 1 wherein said first activation path and said first disabling circuit are connected to a P-channel MOS transistor.

14. The output buffer according to claim 1 wherein said second activation path and said second disabling circuit are connected to an N-channel MOS transistor.

15. An output buffer for non-volatile memories comprising:
a push-pull output stage comprising a P-channel MOS transistor and an N-channel MOS transistor connected between a power supply voltage and ground, said P-channel MOS transistor being connected at a drain thereof to the N-channel MOS transistor;
a first data latch circuit receiving input data from an external data bus;

first and second activation paths connected to said first data latch circuit for activating said push-pull output stage;

first and second enabling circuits connected between said first data latch circuit and said push-pull output stage for enabling said push-pull output stage;

first and second disabling circuits respectively connected between said first and second activation paths and said first data latch circuit for disabling said push-pull output stage and receiving as inputs an output enable signal and a data update signal;

second data latch circuit connected between a gate terminal of said P-channel MOS transistor and said first activation path; and a third data latch circuit connected between a gate terminal of said N-channel MOS transistor and said second activation path.

16. The output buffer according to claim 15 wherein said first and second activation paths are respectively connected to said P-channel MOS transistor and to said N-channel MOS transistor.

17. The output buffer according to claim 16 wherein said first activation path is connected to said second enabling circuit for enabling said P-channel MOS transistor; and wherein said second activation path is connected to said first enabling circuit for enabling said N-channel MOS transistor.

18. The output buffer according to claim 17 wherein said first and second activation paths each respectively comprise a first circuit branch and a second circuit branch; wherein a simultaneous activation of said first circuit branches and said second circuit branches provides a fast initial activation of said P-channel and N-channel MOS transistors; and wherein an activation of only said first circuit branches provides a slow activation of said P-channel and N-channel MOS transistors.

19. The output buffer according to claim 15 wherein an output of said push-pull output stage is taken at a circuit branch connected between said P-channel and N-channel MOS transistors.

20. The output buffer according to claim 15 wherein said first disabling circuit respectively receives as inputs an output signal from said first activation path, an output signal from said first data latch circuit, and an inverted output enable signal; and wherein said second disabling circuit receives as inputs an output signal of said second activation path, the output signal of said first data latch circuit, and an inverted data update signal.

21. An output buffer for a memory comprising:
a push-pull output stage;
a data latch circuit receiving input data from an external data bus;
first and second enabling circuits connected between said data latch circuit and said push-pull output stage for enabling said push-pull output stage; and
first and second disabling circuits connected between said data latch circuit and said push-pull output stage for disabling said push-pull output stage and receiving as inputs an output enable signal and a data update signal.

22. The output buffer according to claim 21 further comprising first and second activation paths connected to said data latch circuit for activating said push-pull output stage; and wherein said first and second disabling circuits are respectively connected between said first and second activation paths and said data latch circuit.

23. The output buffer according to claim 22 wherein said data latch circuit comprises a first data latch circuit; and further comprising second and third data latch circuits connected between said push-pull output stage and, respectively, said first and second activation paths.

24. The output buffer according to claim 22 wherein said push-pull output stage comprises a P-channel MOS transistor and an N-channel MOS transistor connected between a power supply voltage and ground, said P-channel MOS transistor being connected at a drain thereof to the N-channel MOS transistor.

25. The output buffer according to claim 24 wherein said first and second activation paths each respectively comprise a first circuit branch and a second circuit branch; wherein a simultaneous activation of said first circuit branches and said second circuit branches provides a fast initial activation of said P-channel and N-channel MOS transistors; and wherein an activation of only said first circuit branches provides a slow activation of said P-channel and N-channel MOS transistors.

26. A memory device comprising:
    a memory array;
    a data bus connected to said memory array;
    a data latch circuit connected to said data bus for receiving data from said memory array;
    a push-pull output stage;
    first and second enabling circuits connected between said data latch circuit and said push-pull output stage for enabling said push-pull output stage; and
    first and second disabling circuits connected between said data latch circuit and said push-pull output stage for disabling said push-pull output stage and receiving as inputs an output enable signal and a data update signal.

27. The memory device according to claim 26 further comprising first and second activation paths connected to said data latch circuit for activating said push-pull output stage; and wherein said first and second disabling circuits are respectively connected between said first and second activation paths and said data latch circuit.

28. The memory device according to claim 27 wherein said data latch circuit comprises a first data latch circuit; and further comprising second and third data latch circuits connected between said push-pull output stage and, respectively, said first and second activation paths.

29. The memory device according to claim 26 wherein said push-pull output stage comprises a P-channel MOS transistor and an N-channel MOS transistor connected between a power supply voltage and ground, said P-channel MOS transistor being connected at a drain thereof to the N-channel MOS transistor.

30. The memory device according to claim 29 wherein said first and second activation paths each respectively comprise a first circuit branch and a second circuit branch; wherein a simultaneous activation of said first circuit branches and said second circuit branches provides a fast initial activation of said P-channel and N-channel MOS transistors; and wherein an activation of only said first circuit branches provides a slow activation of said P-channel and N-channel MOS transistors.

31. A method for buffering an output of a memory comprising:
    providing a push-pull output stage;
    inputting data to a data latch circuit from an external data bus;
    enabling the push-pull output stage using first and second enabling circuits connected between the data latch circuit and the push-pull output stage; and
    disabling the push-pull output stage using first and second disabling circuits connected between the data latch circuit and the push-pull output stage and receiving as inputs an output enable signal and a data update signal.

32. The method according to claim 31 further comprising activating the push-pull output stage using first and second activation paths connected to the data latch circuit; and wherein the first and second disabling circuit are respectively connected between the first and second activation paths and the data latch circuit.

33. The method according to claim 32 wherein the push-pull output stage comprises a P-channel MOS transistor and an N-channel MOS transistor connected between a power supply voltage and ground, the P-channel MOS transistor being connected at a drain thereof to the N-channel MOS transistor.

34. The method according to claim 33 wherein the first and second activation paths are respectively connected to the P-channel MOS transistor and to the N-channel MOS transistor.

35. The method according to claim 33 wherein the first and second activation paths each respectively comprise a first circuit branch and a second circuit branch; wherein a simultaneous activation of the first circuit branches and the second circuit branches provides a fast initial activation of the P-channel and N-channel MOS transistors; and wherein an activation of only the first circuit branches provides a slow activation of the P-channel and N-channel MOS transistors.

* * * * *